(12) United States Patent
Tanaka et al.

(10) Patent No.: US 7,436,718 B2
(45) Date of Patent: Oct. 14, 2008

(54) SEMICONDUCTOR MEMORY DEVICE INCLUDING FUSE DETECTION CIRCUIT TO DETERMINE SUCCESSFUL FUSE-CUTTING RATE FOR OPTICAL FUSE-CUTTING CONDITIONS

(75) Inventors: Hajime Tanaka, Tokyo (JP); Yosuke Kawamata, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 127 days.

(21) Appl. No.: 11/397,689

(22) Filed: Apr. 5, 2006

(65) Prior Publication Data

US 2006/0239101 A1    Oct. 26, 2006

(30) Foreign Application Priority Data

Apr. 7, 2005    (JP) .............................. 2005-110936

(51) Int. Cl.
*G11C 29/00* (2006.01)
*G11C 7/00* (2006.01)

(52) U.S. Cl. .................. 365/201; 365/189.07; 365/200; 365/225.7; 365/236

(58) Field of Classification Search ........ 365/189.07 X, 365/200 X, 201 O, 225.7 X, 236 X; 714/706, 714/710

See application file for complete search history.

(56) References Cited

U.S. PATENT DOCUMENTS 6,930,935 B2 * 8/2005 Nanba et al. ................. 365/200
7,222,274 B2 * 5/2007 Combs et al. ............... 714/721

FOREIGN PATENT DOCUMENTS

JP    2004-296051    10/2004

* cited by examiner

*Primary Examiner*—VanThu Nguyen
(74) *Attorney, Agent, or Firm*—Sughre Mion, PLLC

(57) ABSTRACT

A fuse detection method for reading out a program state of each fuse and generating a killer signal indicating the program state of the fuse; counting the program state indicated by the killer signal to obtain a count value; inputting an expected value for the program state of the fuse; and determining whether the count value coincides with the expected value by comparing the count value with the expected value.

16 Claims, 6 Drawing Sheets

16

PRIOR ART

SEMICONDUCTOR MEMORY DEVICE INCLUDING FUSE DETECTION CIRCUIT TO DETERMINE SUCCESSFUL FUSE-CUTTING RATE FOR OPTICAL FUSE-CUTTING CONDITIONS

This application claims priority to prior Japanese patent application JP 2005-110936, the disclosure of which is incorporated herein by reference.

BACKGROUND OF THE INVENTION

1. Field of the Invention

The present invention relates to semiconductor memory devices and in particular to a fuse detection method for detecting a program state of fuses and a semiconductor memory device including a fuse detection circuit.

2. Description of the Related Art

In recent years, large-scale integration of semiconductor devices is achieved along with miniaturization of semiconductor elements. This trend is seen especially in the field of semiconductor memory devices. For example, dynamic random access memory (DRAM) products having a memory capacity of 1 Gigabit have been developed and are in actual use.

These semiconductor memory devices include a redundancy memory cell array area for salvage having an extra memory cell array arranged therein, in addition to a main memory cell array area having a normal memory cell array arranged therein. A redundancy circuit for replacing any defective memory cell found in the main memory cell array area with a redundancy memory cell is employed. With this redundancy circuit employed, the production yield of large-scale-integrated semiconductor memory devices is improved and the cost associated with such semiconductor memory devices is reduced. These redundancy circuits require program elements for storing, for example, the addresses of defective memory cells. For these program elements, breaking fuses where polysilicon or metal wiring is cut with a laser trimmer are mainly used.

The application of the redundancy circuit includes (1) replacement of malfunctioning memory cells, (2) replacement of property-defective memory cells, and (3) replacement of low-grade memory cells. The replacement of malfunctioning memory cells in (1) is to salvage memory cells whose basic operation is problematic. This type of salvage is referred to as LFT (Loose Function Test)-defective salvage. The replacement of property-defective memory cells in (2) is to salvage memory cells whose basic operation is normal but, for example, whose switching characteristic or retention property is problematic. This salvage is referred to as property-defective salvage. The replacement of low-grade memory cells in (3) is to replace low-grade memory cells. For this purpose, several grades are set according to the tolerance from a standard value for memory cells that satisfy the standard value. This replacement is referred to as grade salvage.

A practical semiconductor memory device includes redundancy circuits with about 1000 links. Of these 1000 links, in general, about 20 links are used for LFT-defective salvage, about 200 links are used for property-defective salvage, and about 600 links are used for grade salvage. Therefore, most redundancy circuits are used for grade salvage. In the case of grade salvage, salvage starts with low-grade memory cells and proceed towards higher-grade memory cells. When a grade which cannot be salvaged is reached after all links have been used up, the memory cells with the previous grade and lower are replaced. Instead of using up all links, defective memory cells are replaced with redundancy circuits so that the same grades are maintained as chips.

When defective memory cells are replaced with redundancy circuits, it is necessary to confirm the replacement rate as to whether programmed fuses are normally cut and the defective memory cells are replaced as programmed. If programmed fuses are not cut normally, undesired memory cells are replaced with redundancy circuits instead of replacing defective memory cells with redundancy circuits. This results in the chips being determined as detective cells. Therefore, confirmation of the replacement rate is very important. However, since confirmation of the replacement rate is carried out with redundancy circuits for LFT-effective salvage for the following reason, the accuracy of the replacement rate is very low. This is problematic in that effective confirmation of the replacement rate cannot be carried out.

For replacement of defective memory cells with redundancy circuits, replacement for LFT-defective salvage exhibits a reproducibility of 99%, whereas replacement for property-defective salvage exhibits a reproducibility of only 95%. This is because determination as to whether fuses are normally cut also depends on factors such as differences in individual testers and temperature conditions. For grade-salvage replacement, even the reproducibility is unknown. Since grade-salvage replacement is intended to replace low-grade memory cells, the characteristic value of each memory cell needs to be compared directly with a reference value. For this purpose, the characteristic values of memory cells need to be checked one at a time, which is practically impossible. In practice, no more than investigating the extent of characteristic distribution can be carried out. Therefore, confirmation of the replacement rate is carried out using redundancy circuits for LFT-defective salvage with superior reproducibility.

Normally, the number of fuses used for one link of redundancy circuits is 10 to 12, where half the fuses are cut on average. Therefore, 5000 fuses need to be cut in order to program redundancy circuits with 1000 links. Thus, a desired product can be manufactured only after all fuses are cut correctly. With a cutting failure rate of 0.02% (2E-4), the chance of producing a non-defective chip is 50%. To increase this chance to 90%, a failure rate another order of magnitude lower is required. Furthermore, to achieve a success rate of 99%, it is necessary to keep a failure rate of about (1E-6) or lower. From a viewpoint of the replacement rate for LFT-defective salvage, accuracy with a failure rate of only about (2E-2) can be confirmed since about 2% of links are used for LFT-defective salvage. For this reason, whether a chip is non-defective cannot be determined. In short, there is a problem that no methods are available for easily detecting a successful fuse-cutting rate without including the difference in individual testers.

A method of investigating the states of programmed fuses is disclosed in Japanese Unexamined Patent Application Publication No. 2004-296051 (JP-A 2004-296051). It can be confirmed whether fuses have been cut as programmed using the invention disclosed In JP-A 2004-296051. According to JP-A 2004-296051, the program state of each fuse used in redundancy circuits can be confirmed. The number of programmed (cut) fuses is counted and is then compared with the number of fuses to be cut based on data indicating which fuses are to be cut in each chip to confirm whether or not fuses have been cut as programmed. Hereinafter, the percentage of fuses being cut as programmed is referred to as the successful fuse-cutting rate, and the percentage of redundancy circuits being substituted as expected is referred to as the replacement rate.

FIG. 5 shows a redundancy control block 10 described in JP-A2004-296051. The redundancy control block 10 having control units corresponding to each of n redundancy circuits includes redundancy-circuit selection circuits 11, redundancy decoder circuits 12, and a decoder killer circuit 13. The redundancy-circuit selection circuit 11 is a circuit that identifies the n redundancy circuits for selection and output a selection signal SelK. The redundancy decoder circuit 12 includes an enable determination circuit 14, a plurality of address determination circuits 15, and a decoder output circuit 16. In this example, m address determination circuits 15 corresponding to address signals A1 to Am are provided per link.

In a normal operation mode, the enable determination circuit 14 determines whether an enable signal coincides with the program state of an enable fuse, and the plurality of address determination circuits 15 determine whether each bit of an address signal coincides with the program state of an address fuse, thus outputting an enable determination signal EnK and an address determination signal RAi. In a test mode, the enable determination circuit 14 and the plurality of address determination circuits 15 input a low level to the signals for which the program state of a fuse is to be investigated and input a high level to the rest of the signals. The program state of a fuse of the signals to be investigated is output to the determination signals EnK and RAi.

The determination signals EnK and RAi are input to the decoder output circuit 16. In the normal mode, a decoder output signal RedK indicating whether the corresponding redundancy circuit is used is output, and in the test mode the decoder output signal RedK indicating the program state of the corresponding fuse is output. Here, fuse signals (Fen, Fi) of programmed and cut fuses are assumed to be output as high-level signals. The decoder output signal RedK is input to the decoder killer circuit 13, which outputs a killer signal 5. In the test mode, the redundancy control block 10 inputs a low level to signals for which the program state of a fuse is investigated and inputs a high level to the rest of the signals. In this manner, the program state of the fuse of signals to be investigated is output to the determination signals EnK and RAi. Therefore, the programmed and cut fuses can be counted by counting the killer signals 5 output in the test mode.

However, the invention of this earlier application has a problem in that it takes a long measurement time. Counting the number of cut fuses can be achieved by testing each fuse in one memory cycle and reading out the test result indicating whether the fuse is programmed (cut). However, normal testers do not have means for counting only the cut fuses. Although counting can be carried out using a fail bitmap, a tester having a fail bitmap is very expensive and hence, is not mass-productive. For this reason, one fuse is tested in one test cycle, and the result is determined.

Although the memory cycle during test is about 100 ns, a test cycle of about 1 ms is required to determine pass/fail of data. If one fuse is tested in one test cycle, the test time is prolonged. A time of about 10 seconds is required to test 10000 fuses for one semiconductor chip. Furthermore, if 500 to 1000 chips are mounted on one wafer, about a two-hour measurement time is required per wafer. This means that it is practically impossible to monitor the fuse program accuracy through mass-production online measurement. Therefore, even with the invention in the earlier application, the replacement rate of redundancy circuits cannot be confirmed through mass-production online monitoring of the successful fuse-cutting rate.

Semiconductor memory devices use redundancy circuits to improve the production yield and reduce cost. Unfortunately, it is not possible to confirm whether fuses of redundancy circuits are normally cut and the redundancy circuits are substituted as programmed.

SUMMARY OF THE INVENTION

In light of these circumstances, an object of the present invention is to provide a simple fuse detection method that can be carried out by means of mass-production online and a semiconductor memory device including a fuse detection circuit.

According to one aspect of the invention, a semiconductor memory device comprises a fuse detection circuit. The fuse detection circuit includes: a redundancy control block configured to read out a program state of each program element, the program state being one of a written sate and an unwritten state, and generate a killer signal indicating one of the written state and the unwritten state of the program element; and a fuse-count determination circuit. The fuse-count determination circuit has a counter circuit configured to count one of the written state and unwritten state indicated by the killer signal; a fuse block including an expected value for one of the written state and the unwritten state of the program element; and a coincidence detection circuit configured to compare the count by the counter circuit with the expected value to determine whether the count coincides with the expected value.

The expected value in the fuse block may include only a part of low-order bits of the expected value.

The counter circuit may be incremented in response to a count signal input by a tester.

The killer signal may be output every one command cycle.

The redundancy control block may include a redundancy circuit selection circuit; a redundancy decoder circuit; and a decoder killer circuit, wherein the redundancy decoder circuit outputs a program state of each fuse.

The redundancy decoder circuit may include an enable determination circuit configured to output a program state of an enable fuse; an address determination circuit configured to output a program state of an address fuse; and a decoder output circuit, wherein the decoder output circuit receives outputs from the enable determination circuit and the address determination circuit and outputs a program state of each fuse.

In another aspect of the invention, a semiconductor memory device comprises: a fuse detection circuit for detecting program information stored in fuse elements including a redundancy control circuit and a fuse count determination circuit. The redundancy control circuit is for controlling addresses of a redundancy memory array included in a semiconductor memory device, and generates a killer signal indicating one of a written state and an unwritten state read out from each of the fuse elements. The fuse count determination circuit includes; a counter circuit responsive to the killer signal for counting one of the written state and the unwritten state of the fuse elements to producing a count; storing means for storing data representing an expected value of fuse elements in one of the written state and the unwritten state; a coincidence detection circuit configured to compare the count with the data representing the expected value to determine whether the count coincides with the expected value.

In a yet further aspect of the invention, a fuse detection method of the present invention comprises the steps: reading out a program state of each program element, the program state being one of a written sate and an unwritten state, and generating a killer signal indicating one of the written state and the unwritten state of the program element; counting one of the written state and unwritten state indicated by the killer signal to obtain a count value; inputting an expected value for one of the written state and the unwritten state of the program element; and determining whether the count value coincides with the expected value by comparing the count value with the expected value.

According to a further aspect of the invention, a fuse detection circuit of the present invention includes: a redundancy control block configured to read out a program state of each program element, the program state being one of a written sate and an unwritten state, and generate a kilter signal indicating one of the written state and the unwritten state of the program element; and a fuse-count determination circuit. The fuse-count determination circuit includes: a counter circuit configured to count one of the written state and unwritten state indicated by the killer signal; a fuse block including an expected value for one of the written state and the unwritten state of the program element; and a coincidence detection circuit configured to compare the count by the counter circuit with the expected value to determine whether the count coincides with the expected value.

According to a specific feature of the invention, a fuse detection circuit for detecting program information stored in fuse elements comprises: a redundancy control circuit for controlling addresses of a redundancy memory array included in a semiconductor memory device, the redundancy control circuit generating a killer signal indicating one of a written state and an unwritten state read out from each of the fuse elements; and a fuse count determination circuit. The fuse count determination circuit includes; a counter circuit responsive to the killer signal for counting one of the written state and the unwritten state of the fuse elements to producing a count; storing means for storing data representing an expected value of the fuse elements in one of the written state and the unwritten state; a coincidence detection circuit configured to compare the count with the data representing the expected value to determine whether the count coincides with the expected value.

The program states of fuses are read out, the number of programmed fuses is counted and is then compared with an expected value to detect whether the number of programmed fuses matches the expected value. With this structure, the successful fuse-cutting rate is obtained to determine optimal fuse-cutting conditions. According to the present invention, a simple fuse detection method that can be carried out by means of mass-production online and a semiconductor memory device including a fuse detection circuit are provided.

DESCRIPTION OF THE PREFERRED EMBODIMENTS

A fuse detection method and a semiconductor memory device including a fuse detection circuit according to the present invention will now be described with reference to the drawings.

Figure 6:
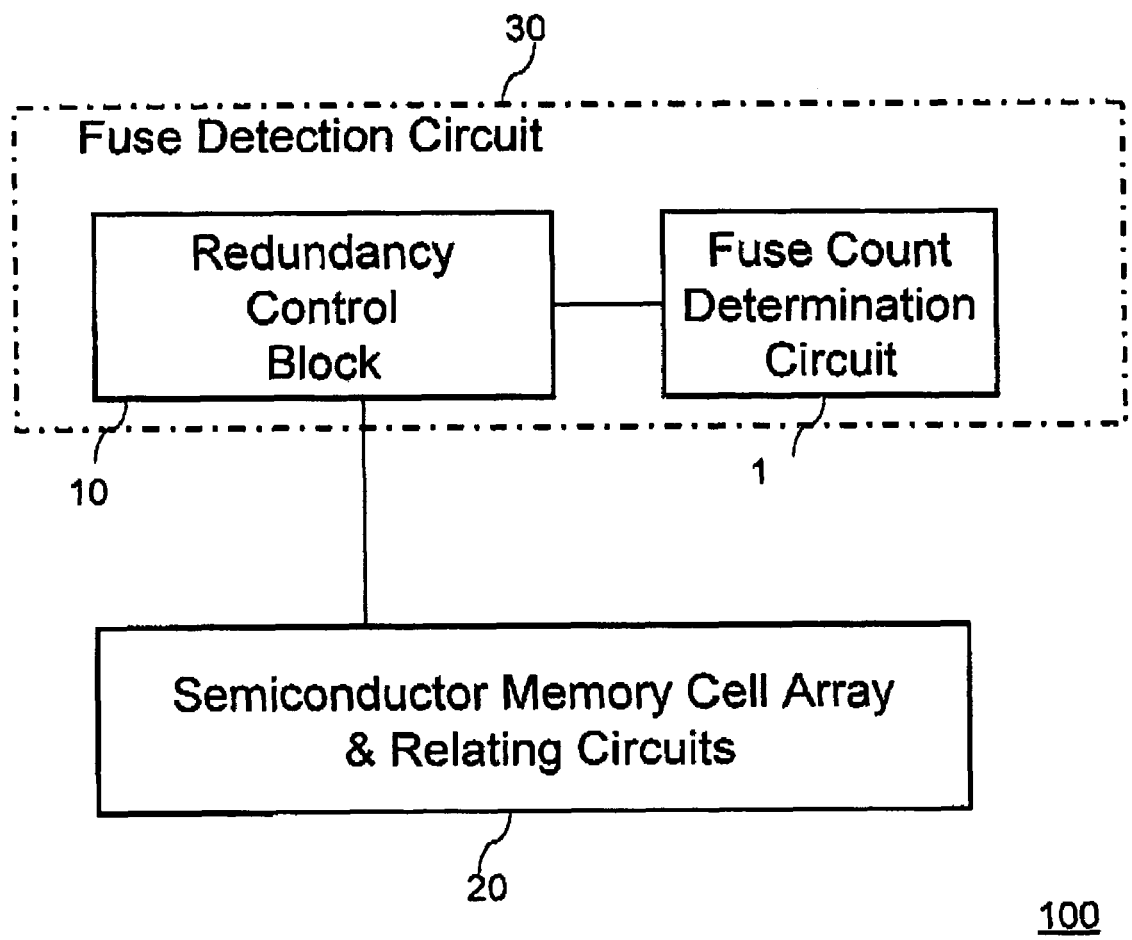
FIG. 6 is a block diagram of a semiconductor memory device together with a fuse detection circuit according to an embodiment of the invention.

FIG. 6 illustrates a semiconductor memory device having a fuse detection circuit built therein.

The semiconductor memory device 100 includes a semiconductor memory cell array and its relating circuit 20, a redundancy control block 10, or a redundancy control circuit, and a fuse-count determination circuit 1. The fuse count circuit 30 is configured to have the redundancy control block 10 and the fuse-count determination circuit 1.

Figure 1:
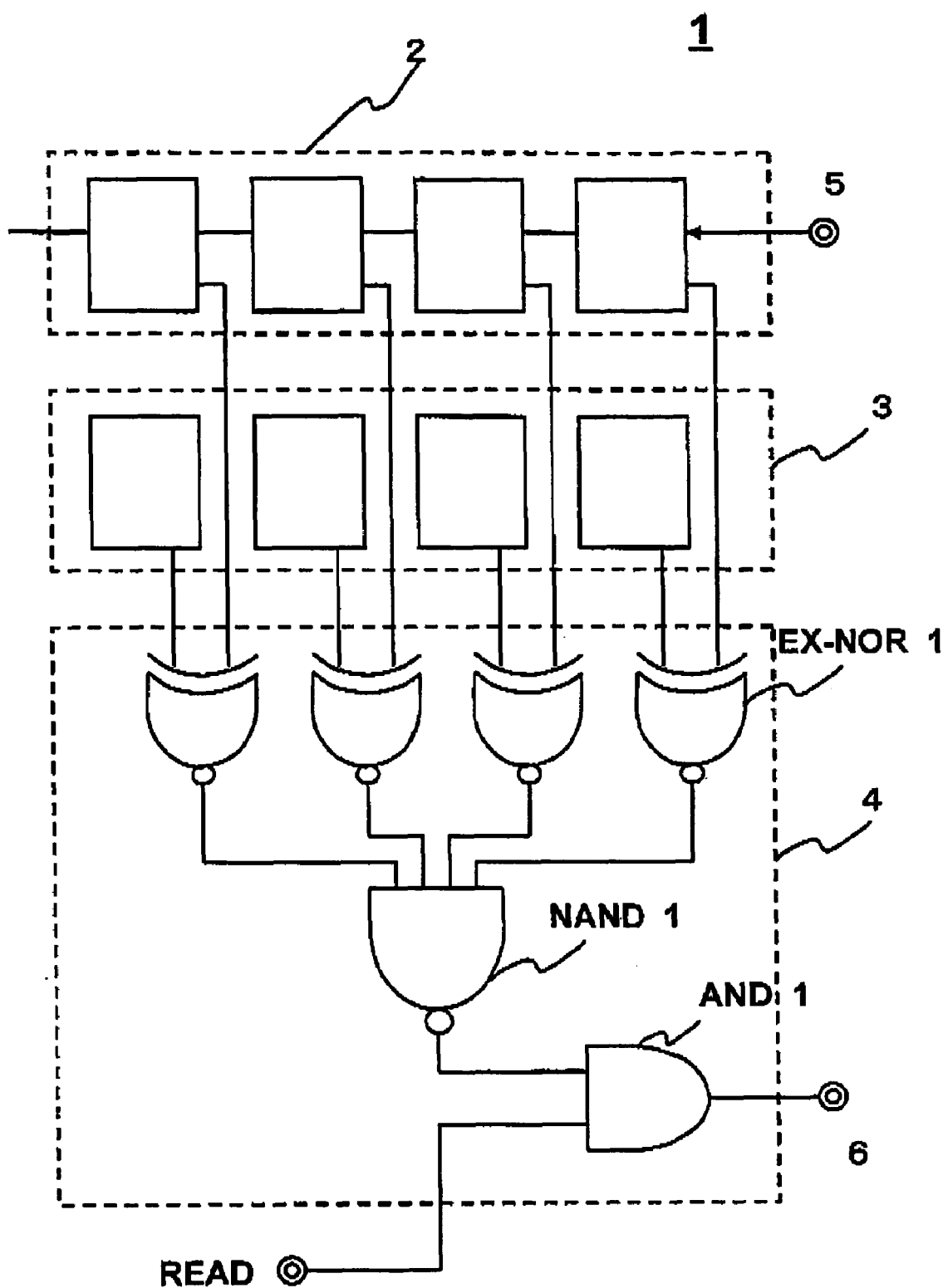
FIG. 1 is a diagram showing a fuse-count determination circuit employed in an embodiment of the present invention.
Figure 5:
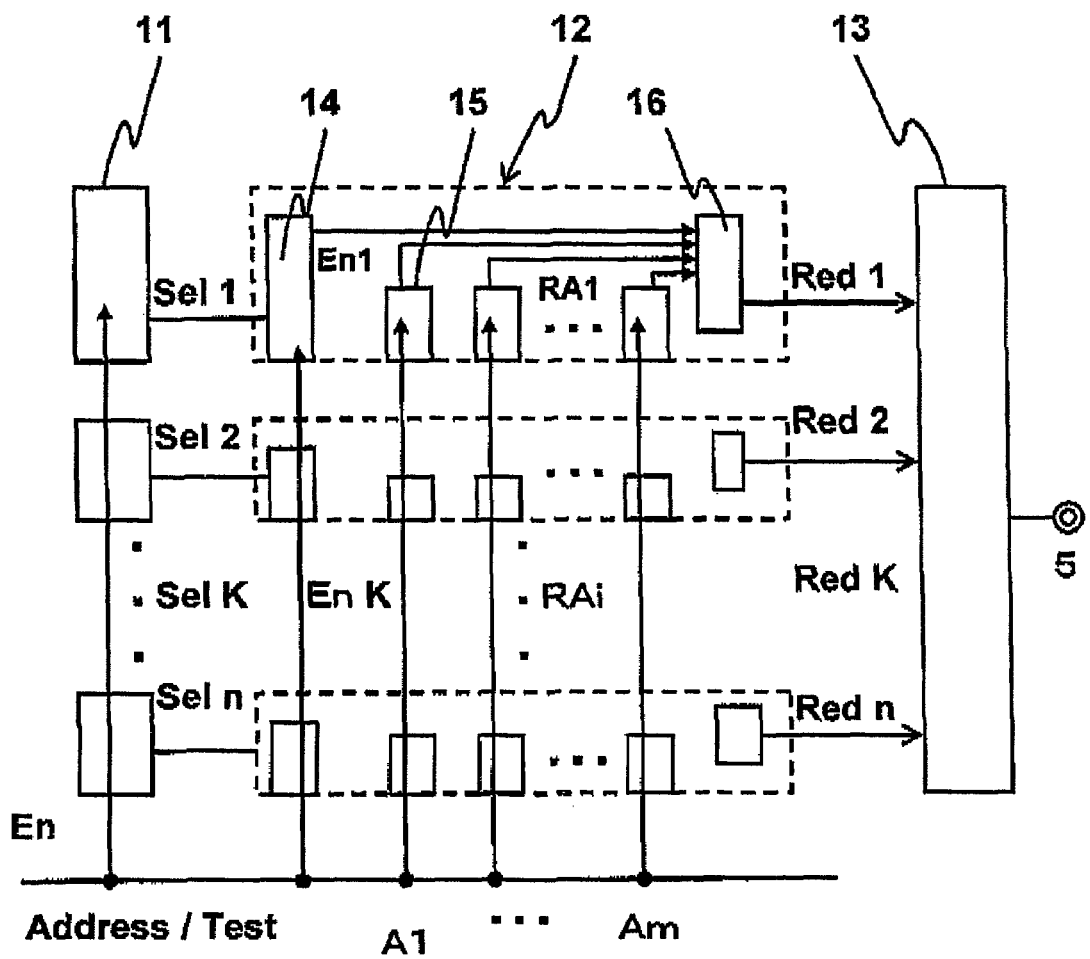
FIG. 5 is a diagram showing a redundancy control block prior art which is employed in an embodiment of the present invention.

FIG. 1 shows the fuse-count determination circuit 1 employed in the embodiment. A killer signal 5 indicating whether each fuse is cut is input to the fuse-count determination circuit 1, which counts the number of high-level signals of the killer signals 5, compares the counted number with an expected value of the number of fuses to be cut, and outputs a coincidence output 6 indicating whether the counted number coincides with the expected value. The killer signal 5 from the redundancy control block 10 shown in FIG. 5 is input.

The fuse-count determination circuit 1 includes a counter 2 to which the killer signal 5 is input; a fuse block 3, or a fuse-number storing means, receiving an expected value representing the number of fuses to be programmed from among the fuses in the redundancy circuits; and a coincidence detection circuit 4. The coincidence detection circuit 4 includes a plurality of coincidence circuits EX-NOR1 comparing between outputs from the counter 2 and outputs from the fuse block 3 on a bit-by-bit basis to determine whether these outputs match; a NAND circuit NAND1 receiving the output from each coincidence circuit EX-NOR1; and an AND circuit AND1 receiving the output from the NAND circuit NAND1 and a determination read-out signal READ and outputting the coincidence output 6.

The killer signal 5 is input to the counter 2, which counts up the number of killer signals 5, The counter 2 can be realized by, for example, a binary counter. The killer signal 5 is generated by the redundancy control block 10 shown in FIG. 5. It is a signal indicating the program state of a fuse, namely, whether the fuse is programmed ant cut. The current example assumes that when a fuse is written and cut, the killer signal 5 is output as a high-level signal. The counter 2 counts up the number of high levels of the killer signal 5 to count the number of cut fuses.

In the fuse block 3, an expected value representing the number of fuses to be cut is also programmed when a fuse in the redundancy circuits is cut. In this example, display is given in binary, as with the counter 2. In this case, only lower bits of the expected value can be programmed in the fuse block 3. If replacement for LFT-defective salvage exhibits a reproducibility of 99%, the current fuse-cutting success rate is 99.9%. In other words, several to about a dozen of fuses are cut unsuccessfully when 10000 fuses are cut. Therefore, it is sufficient to compare, for example, only the low-order 4 to 5 bits (in case of binary). In FIG. 1, only low-order four bits are shown.

The coincidence circuit EX-NOR1 in the coincidence detection circuit 4 is provided for each bit to determine whether the counter output matches the expected value. Each bit output from the counter circuit 2 and each bit output of the expected value programmed in the fuse block 3 are input. If the counter output matches the expected value, a high level is output. If the counter output does not match the expected value, a low level is output. The output from each coincidence circuit EX-NOR1 is input to the NAND circuit NAND1, and if all inputs are at a high level, a low level is output. The output of the NAND circuit NAND1 and the read-out signal READ are input to the AND circuit AND1, which outputs the coincidence output 6 indicating whether all bit outputs from the counter 2 match the respective bit outputs of the expected value. The read-out signal READ is a timing signal with which the coincidence output 6 is output when the test of all fuses to be read out is completed. This read-out signal READ is optional.

Furthermore, if the coincidence output 6 indicates that matching has not been achieved, the counter 2 can further be incremented so that the coincidence output 6 indicates a coincidence output. It is assumed that when fuses are cut, there are remaining fuses that are not cut because cutting is not complete. In this case, the counter 2 reads a smaller count value. For example, if the counter 2 reads 4997 when the expected value is 5001, a coincidence signal indicates noncoincidence. At this time, a coincidence output is obtained when the counter 2 is forcibly incremented four times. Therefore, it can be confirmed that the number of uncut fuses is four.

As a method of forcibly incrementing the counter 2, an increment command is introduced newly so that each time the increment command is issued, one pulse is output and a signal obtained by calculating a logical OR between this pulse and the killer signal 5 is input to the counter 2. By issuing this increment command, the counter 2 can be forcibly incremented with a tester.

Also when only lower bits 01, or first and second least significant bits, are programmed as an expected value at this time, it can be confirmed that the number of uncut fuses is four because incrementing four times results in a coincidence output. If the counter is composed of four bits as in this embodiment, applying 16 pulses returns the counter to the original value. Therefore, when coincidence is achieved by applying 15 pulses, it can be determined that one more fuse than necessary is cut (a fuse which should not be cut was out) rather than determining that there remain 15 uncut fuses. Based on the difference between the number of cut fuses and the expected value, a fuse-cutting success rate is obtained, as well as whether the difference indicates over-cutting or under-cutting. Therefore, more stable fuse-cutting conditions are obtained by feeding back these results to condition settings for a laser trimmer in the fuse-cutting process.

The generation of the killer signal 5 will be described with reference to FIG. 5. When the redundancy control block 10, which outputs the killer signal 5, enters the test mode, it outputs a high-level killer signal 5 if a fuse is cut and outputs a low-level killer signal 5 if the fuse is not cut. The redundancy control block 10 continuously outputs a high level or a low level depending on the program state of each fuse every memory cycle and outputs the high-level or low-level signal to the counter 2 as the killer signal 5. All fuses are tested based on a control signal from the tester, and killer signals for all fuses are output. Here, the memory cycle is a conceptual cycle from when the program state of a fuse is read out, a killer signal is output, and to when processing is completed in the counter circuit to which the killer signal is input. An actual memory cycle is specified by a command or a clock. For example, a fuse read-out command can be provided so that the program state of a fuse is read out and a killer signal is output, thus allowing the counter circuit that has received the killer signal to carry out counting.

Here, each individual killer signal 5 is not subjected to pass/fail determination; it does no more than output the program state of the corresponding fuse. For this reason, one fuse can be tested, for example, in 100 ns memory cycles. It takes a test time of only 10 ms even if 10000 fuses are provided per chip. Furthermore, if 500 to 1000 chips are mounted on one wafer, it takes a measurement time of 5 to 10 seconds per wafer. In addition, the fuse-count determination circuit 1 is built in chips. By building the fuse-count determination circuit 1 in chips, concurrent measurement of the chips is possible. By carrying out concurrent measurement of the chips, the successful fuse-cutting rate of a plurality of chips can be concurrently determined in a test time of 10 ms. Therefore, the successful fuse-cutting rate indicating whether or not fuses are normally programmed can be monitored by means of mass-production online. Furthermore, the difference between the number of cut fuses and the expected value can be represented on a wafer map. By doing so, if over-cutting (under-cutting) is seen at random based on the distribution of the wafer map, it is confirmed that laser power is intense (weak). Moreover, if the distribution is not uniform, a guess can be made as to whether the nonuniform distribution is due to other characteristics of the apparatus, due to nonuniformity of the diffusion film thickness, and so forth. This is advantageous in obtaining quick feedback.

The fuse-count determination circuit used in the embodiment includes a counter circuit; a fuse block in which an expected value is programmed; and a coincidence detection circuit which compares between the output of the counter circuit and the expected value to output a coincidence signal. The number of killer signals indicating the program states of fuses is counted and is then compared with the expected value to output a result of coincidence/noncoincidence. In the case of noncoincidence, the counter circuit is further incremented to confirm the number of uncut fuses. By confirming the number of uncut fuses and feeding back it to condition settings for the laser trimmer in the fuse-cutting process, more stable fuse-cutting conditions are obtained. This contributes to an increase in the replacement rate of redundancy circuits and an improvement in the production yield of semiconductor memory devices.

The successful cutting rate of fuses is obtained by using the fuse count determination circuit. In this manner, a detection method for detecting the program state of a fuse and a semiconductor memory device having a fuse detection circuit are provided.

Figures 2A, 2B:
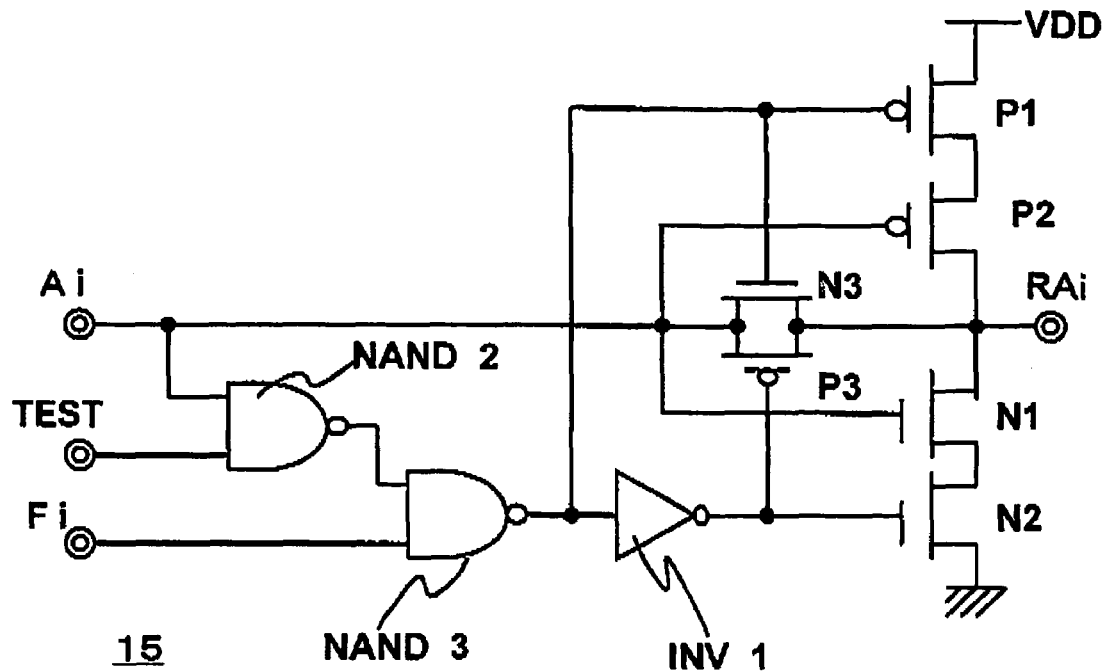
FIGS. 2A and 2B are diagrams showing address determination circuits employed in an embodiment of the present invention.

Referring to FIGS. 2A and 2B, together with FIG. 5, the address determination circuit 15 used in the redundancy control block 10 is described. Moreover, this embodiment is an example where an enable bit is used on a one-address one-fuse basis as described in JP-A 2004-296051. This is prevalent because an exclusive-OR circuit EX-OR and an exclusive-NOR circuit EX-NOR can be made relatively compact by using a complex gate. An enable bit is required to prevent address 0 or FF (address with all address bits of one) from being selected for all unwritten redundancy circuits. The address determination circuit 15 is provided for each address signal of each link.

FIG. 2A shows a first address determination circuit, and FIG. 2B shows a second address determination circuit. Each address determination circuit receives an address signal Ai; an address fuse signal Fi; and a test signal TEST and outputs an address determination signal RAi. As shown in FIG. 5, the redundancy circuits 10 include n links. The K-th link is denoted as K. Furthermore, each link includes a plurality of the address determination circuits, one of which is represented as an address signal Ai and an address fuse signal Fi.

When the test signal TEST is at a low level in the normal mode, an address determination signal circuit becomes a coincidence circuit. It outputs a high level if the address signal Ai matches the address fuse signal Fi, and it outputs a low level if the address signal Ai does not match the address fuse signal Fi. Address determination signal RAi=Ai·/Fi+/Ai·Fi holds. When the output test signal TEST is at a high-level in the test mode, the address determination circuit outputs the program state of the fuse. The address fuse signal Fi to be investigated is output by inputting a low level to address signals for which the program state of a fuse is to be investigated and inputting a high level to the rest of the address signals. Address determination signal RAi=Ai+/Ai·Fi holds.

The first address determination circuit in FIG. 2A includes NAND circuits NAND2 and NAND3; an inverter circuit INV1; NMOS transistors N1, N2, and N3; and PMOS transistors P1, P2, and P3. The address signal Ai and the test signal TEST are input to the NAND circuit NAND2, and the output from the NAND circuit NAND2 is supplied to the NAND circuit NAND3. The address fuse signal Fi and the output from the NAND circuit NAND2 are input to the NAND circuit NAND3, and the output from the NAND circuit NAND3 is supplied to the inverter circuit INV1, the PMOS transistor P1, and the NMOS transistor N3. The inverter circuit INV1 inverts the output of the NAND circuit NAND3 and outputs the resultant signal to both the PMOS transistor P3 and the NMOS transistor N2.

The drain, the source, and the gate of the PMOS transistor P1 are connected to the source of the PMOS transistor P2, a power supply VDD, and the output of the NAND circuit NAND3, respectively. The drain, the source, and the gate of the PMOS transistor P2 are connected to the drain of the NMOS transistor N1, the drain of the PMOS transistor P1, and the address signal Ai, respectively. The drain, the source, and the gate of the NMOS transistor N1 are connected to the drain of the PMOS transistor P2, the drain of the NMOS transistor N2, and the address signal Ai, respectively.

The drain, the source, and the gate of the NMOS transistor N2 are connected to the source of the NMOS transistor N1, a ground potential GND, and the output of the inverter circuit INV1, respectively. The address determination signal RAi is output from a node between the drain of the NMOS transistor N1 and the drain of the PMOS transistor P2. The NMOS transistor N3 and the PMOS transistor P3 constitute a transfer gate, which is interposed between the address signal Ai and the address determination signal RAi. The gates are connected to the output of the NAND circuit NAND3 and the output of the inverter circuit INV1, respectively.

With these structures, when the output test signal TEST is at a low level in the normal mode, the address determination signal circuit becomes a coincidence circuit to output the address determination signal RAi=Ai·/Fi+/Ai·Fi. When the output test signal TEST is at a high level in the test mode, the address determination circuit outputs the program state of the fuse as the address determination signal RAi=Ai+/Ai·Fi, In the test mode, the address signals to be tested are set to a low level, and the other address signals are set to a high level. The other address signals are at a high-level, and their address determination signals RAi are set to a high level. This means that the address determination signal RAi ignores fuse determination and outputs a high level. The address signal to be tested is at a low level, resulting in the corresponding address determination signal RAi=Fi. Thus, the program state of the fuse is output.

Although an exclusive-OR circuit EX-OR between Ai and Fi is employed in this embodiment, the address determination signal RAi can be determined with an exclusive-NOR circuit EX-NOR. This is achieved by supplying the output of the inverter circuit INV1 to the gates of the transistors P1 and N3 and the output of the NAND circuit NAND3 to the gates of transistors P3 and N2 in the circuit diagram of FIG. 2A. Whether an exclusive-OR circuit or an exclusive-NOR circuit is used is a matter of design selection; the number of cut fuses is counted in one circuit, and the number of uncut fuses is counted in the other. However, as described later, there are some redundancy circuits where the logic of the exclusive-OR circuit EX-OR and the logic of the exclusive-NOR circuit EX-NOR are mixed. In this case, the number of cut fuses and the number of uncut fuses are added, which is not a desired operation. In the example shown below, the number of cut fuses is counted irrespective of both types of logic being mixed.

The second address determination circuit of FIG. 2B includes NAND circuits NAND4 and NAND5; a coincidence circuit EX-NOR2; an inverter circuit INV2; NMOS transistors N1, N2, and N3; and PMOS transistors P1, P2, and P3. The address signal Ai and the test signal TEST are input to the NAND circuit NAND4, and the output from the NAND circuit NAND4 is supplied to the NAND circuit NAND5. The address fuse signal Fi and the output from the NAND circuit NAND4 are input to the NAND circuit NAND5, and the output from the NAND circuit NAND5 is supplied to the coincidence circuit EX-NOR2. The output from the NAND circuit NAND5 and the test signal TEST are input to the coincidence circuit EX-NOR2, and the output from the coincidence circuit EX-NOR2 is supplied to the inverter circuit INV2, the PMOS transistor P3, and the NMOS transistor N2. The inverter circuit INV2 inverts the output of the coincidence circuit EX-NOR2 and outputs the resultant signal to the PMOS transistor P1 and the NMOS transistor N3.

The drain, the source, and the gate of the PMOS transistor P1 are connected to the source of the PMOS transistor P2, the power supply VDD, and the output of the inverter circuit INV2, respectively. The drain, the source, the gate of the PMOS transistor P2 are connected to the drain of the NMOS transistor N1, the drain of the PMOS transistor P1, and the address signal Ai, respectively. The drain, the source, the gate of the NMOS transistor N1 are connected to the drain of PMOS transistor P2, the drain of the NMOS transistor N2, and the address signal Ai, respectively.

The drain, the source, and the gate of the NMOS transistor N2 are connected to the source of the NMOS transistor N1, the ground potential GND, and the output of the coincidence circuit EX-NOR2, respectively. The address determination signal RAi is output from a node between the drain of the NMOS transistor N1 and the drain of the PMOS transistor P2. The NMOS transistor N3 and the PMOS transistor P3 constitute a transfer gate, which is interposed between the address signal Ai and the address determination signal RAi. The gates are connected to the output of the inverter circuit INV2 and the output of the coincidence circuit EX-NOR2, respectively.

With these structures, when the output test signal TEST is at a low level in the normal mode, the address determination signal circuit becomes a coincidence circuit to output the address determination signal RAi=Ai*/Fi+/Ai*/Fi. When the output test signal TEST is at a high level in the test mode, the address determination circuit outputs the program state of the fuse as the address determination signal RAi=Ai+/Ai*Fi. Therefore, in the test mode, a low level is input to signals for which the program state of a fuse is investigated and a high level is input to the rest of the signals so that the program state of the fuse of signals to be investigated is output to the determination signals EnK and RAi. Therefore, the programmed and cut fuses can be counted by counting the killer signals 5 output in the test mode. By doing so, the address determination signal RAi=Ai+/Ai*Fi is output when the program state of a fuse is investigated, regardless of whether an exclusive-OR circuit EX-OR or an exclusive-NOR circuit EX-NOR is used, and therefore, measurement can be carried out without distinguishing between the two types of circuits.

In the address determination circuit of this embodiment, a low level is input to address signals for which the program state of an address fuse is investigated and a high level is input to the rest of the address signals in the test mode so that the program state of the fuse of signals to be investigated is output to the determination signal RAi. A signal indicating the program state of each fuse is obtained by using this address determination circuit, and thus, a fuse detection method for detecting a program state of a fuse and a semiconductor memory device including a fuse detection circuit are provided.

[Third Embodiment]

Figure 3A:
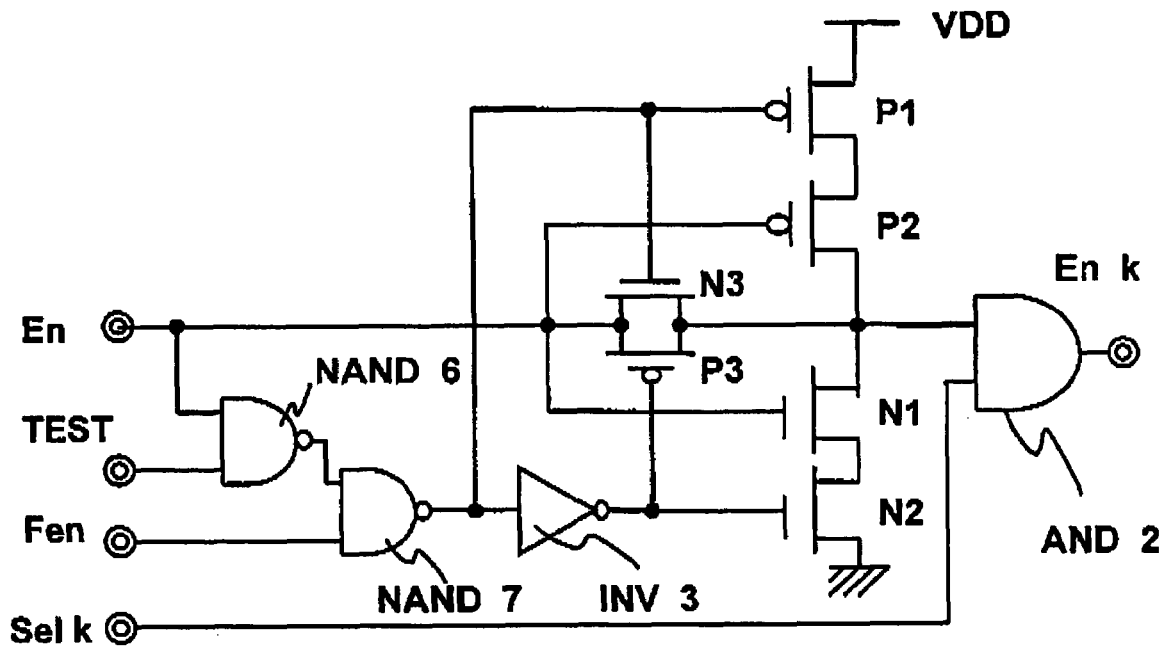
FIGS. 3A and 3B are diagrams showing enable determination circuits employed in an embodiment of the present invention.
Figure 3B:
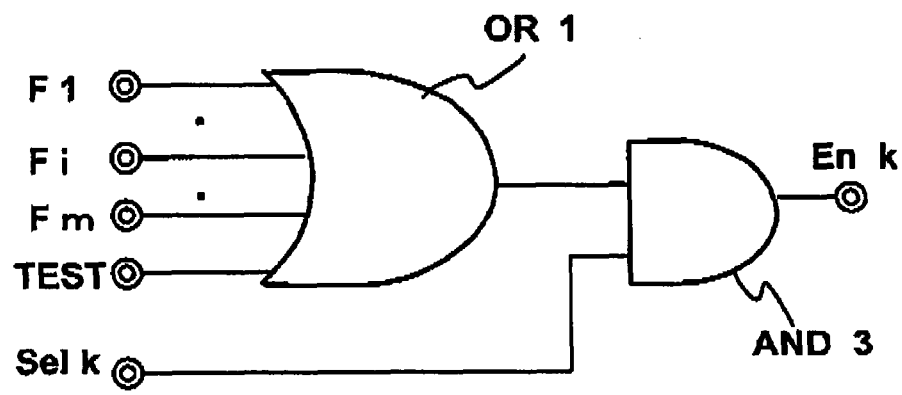

Referring to FIGS. 3A and 3B together with FIG. 5, the enable determination circuit 14 used in the redundancy control block 10 is described. One enable determination circuit 14 is provided for each link. FIG. 3A shows a first enable determination circuit, and FIG. 3B shows a second enable determination circuit.

The first enable determination circuit of FIG. 3A receives an enable signal En, an enable fuse signal Fen, a test signal TEST, and a selection signal SelK as inputs and outputs an enable determination signal EnK. The selection signal SelK is a selection signal indicating whether a corresponding link is selected by the output from a redundancy-circuit selection circuit. The first enable determination circuit includes NAND circuits NAND6 and NAND7; an inverter circuit INV3; an AND circuit AND2; NMOS transistors N1, N2, and N3; and PMOS transistors P1, P2, and P3.

The enable signal En and the test signal TEST are input to the NAND circuit NAND6, and the output from the NAND circuit NAND6 is supplied to the NAND circuit NAND7. The enable fuse signal Fen and the output from the NAND circuit NAND6 are input to the NAND circuit NAND7, and the output from the NAND circuit NAND7 is supplied to the inverter circuit INV3, the PMOS transistor P1, and the NMOS transistor N3. The inverter circuit INV3 inverts the output of the NAND circuit NAND7 and outputs the resultant signal to both the PMOS transistor P3 and the NMOS transistor N2. The selection signal SelK and a node between the drain of the PMOS transistor P2 and the drain of the NMOS transistor N2 are connected to the AND circuit AND2, which outputs the enable determination signal EnK.

The drain, the source, and the gate of the PMOS transistor P1 are connected to the source of the PMOS transistor P2, a power supply VDD, and the output of the NAND circuit NAND7, respectively. The drain, the source, and the gate of the PMOS transistor P2 are connected to the drain of the NMOS transistor N1, the drain of the PMOS transistor P1, and the enable signal En, respectively. The drain, the source, and the gate of the NMOS transistor N1 are connected to the drain of the PMOS transistor P2, the drain of the NMOS transistor N2, and the enable signal En, respectively.

The drain, the source, and the gate of the NMOS transistor N2 are connected to the source of the NMOS transistor N1, a ground potential GND, and the output of the inverter circuit INV3, respectively, The NMOS transistor N3 and the PMOS transistor P3 constitute a transfer gate, which is connected between the enable signal En and a node between the drain of the PMOS transistor P2 and the drain of the NMOS transistor N1. The gates are connected to the output of the NAND circuit NAND7 and the output of the inverter circuit INV3, respectively.

With these structures, if the selection signal SelK from the redundancy selection circuit 11 is at a low level and the corresponding link is not selected, the enable determination signal EnK is output as a low level signal. If the selection signal SelK from the redundancy selection circuit 11 is at a high level and the corresponding link is selected, the enable determination signal EnK=En*TEST+/En*Fen is output. The enable determination signal EnK is output as a high-level signal when the enable signal En is at a high level in the test mode (i.e., when the TEST signal is at a high level). Furthermore, when the enable signal En is at a low level, the enable determination signal EnK is output as a high level signal (if the fuse is cut) or as a low level signal (if the fuse is not cut) depending on the program state of the enable fuse.

Therefore, in the test mode (i.e., the TEST signal is at a high level), when the enable signal En is at a low level, the program state of the enable fuse is output as the enable determination signal EnK of the enable determination circuit.

The second enable determination circuit of FIG. 3B shows a case where no enable fuses are provided. In short, if no fuses are programmed, it is determined that this redundancy circuit is not used. Assuming that a 1 is output when a fuse is programmed, it is determined that this redundancy circuit is used if at least one of all address fuses is programmed (by calculating a logical OR of F1 to Fm), and thus an enable is output.

In this case, the second enable determination circuit input all address fuse signals F1 to Fi and to Fm in one link, the test signal TEST, and the selection signal SelK and outputs the enable determination signal EnK. The second enable determination circuit includes an OR circuit OR1 and an AND circuit AND3. All address fuse signals F1 to Fi and to Fm in one link and the test signal TEST are input to the OR circuit OR1, and the output from the OR circuit OR1 is supplied to the AND circuit AND3. The output of the OR circuit OR1 and the selection signal SelK are input to the AND circuit AND3, which outputs the enable determination signal EnK.

A logical table is expressed by enable determination signal Enk=SelK*(TEST+Fi). When the test signal TEST is at a high level, enable determination signal Enk=SelK holds. When the test signal TEST is at a low level, enable determination signal Enk=SelK*Fi holds. Since no enable fuses are used in the second enable determination circuit shown in FIG. 3B, it is not necessary to confirm the program state of an enable fuse in the test mode.

In redundancy circuits which do not require such an enable fuse, an address selected when no address fuses are cut (e.g., address 0) cannot be replaced with a redundancy circuit. If, for example, an exclusive-OR circuit EX-OR is employed for the logic of addresses and fuses, a measure against this drawback can be taken as follows: when part or all of the logic of the addresses and fuses is achieved by an exclusive-NOR circuit EX-NOR for at least one set of redundancy circuits, address 0 can be replaced by cutting all fuses at addresses using the exclusive-NOR circuit EX-NOR in the set of redundancy circuits which use the exclusive-NOR circuit EX-NOR. This is an example where the logic of the exclusive-OR circuit EX-OR and the logic of the exclusive-NOR circuit EX-NOR are mixed.

In the enable determination circuit of this embodiment, when the program state of an enable fuse is to be investigated in the test mode, the program state of the enable fuse is output by inputting a low level to the enable signal. By using this enable determination circuit, a signal indicating the program state of a fuse is obtained, and thus, a detection method for detecting the program state of a fuse and a semiconductor memory device having a fuse detection circuit are provided.

Figure 4:
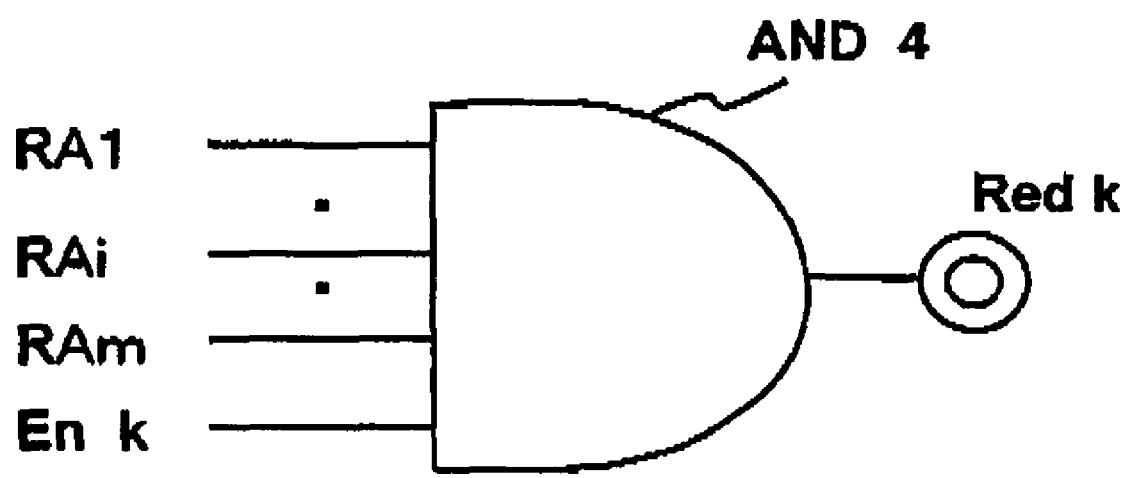
FIG. 4 is a diagram showing a decoder output circuit employed in an embodiment of the present invention.

With reference to FIG. 4, a decoder output circuit 16 used in the redundancy control block 10 will now be described. The decoder output circuit 16 is provided for each link and includes an AND circuit AND4. An enable determination signal EnK of the enable determination circuit 14, address determination signals RA1 to RAi and to RAm from the address determination circuit are input to the AND circuit AND4, which outputs an output RedK.

If all input signals coincide with the contents programmed in fuses for the enable determination signal EnK and the address determination signal RAi when the test signal TEST is at a low level in the normal operation mode, the corresponding link of redundancy circuits is selected, a redundancy memory cell is selected by the killer signal, and no normal memory cells are selected. When the test signal TEST is at a high level in the test mode, the program state of a signal fuse to be investigated is output to the decoder output RedK by inputting a low level to signals for which the program state of a fuse is to be investigated (enable signal or address signal) and inputting a high level to the rest of the signals.

The enable determination signal from the enable determination circuit and the address determination signal from the address determination circuit are input to the decoder output address circuit of this embodiment. In the test mode, a low level is input to signals for which the program state of an address fuse is investigated and a high level is input to the rest of the signals so that the program state of the fuse of signals to be investigated is output to the decoder output circuit. A signal indicating the program state of each fuse is obtained by using this decoder output circuit, and thus, a fuse detection method for detecting a program state of a fuse and a semiconductor memory device including a fuse detection circuit are provided.

As described, the program information of the fuses is read out individually, and the results are generated as killer signals 5. As described, it can be checked whether correct programming has been carried out by counting the killer signals 5 with an internal fuse counter circuit and comparing it with a pre-programmed expected value. As a general read-out method, an m-ary counter (address counter) (alternatively, an m-bit shift register is acceptable, which is also applicable hereinafter) for specifying each of m addresses to be read out and an n-ary counter (redundancy counter) corresponding to the number n of sets of redundancy circuits are provided. Each counter (address counter, redundancy counter, and program fuse counter) is reset with a start command. For example, if the address counter is incremented and a carry occurs, the redundancy counter may be incremented with that carry to check the subsequent set of the redundancy circuits and termination may be triggered with the carry from the redundancy counter.

Although a killer signal is generated in one memory cycle, because the structure of redundancy circuits and the startup circuit of the killer circuit differ between the row system and the column system, batch operation imposes such considerable load on circuit design that the size of the circuit is increased. To overcome this problem, the row system is separated from the column system for counting. For example, a read-out command, a command for the row system, and a command for the column system can be provided. The read-out command generates and destructs a startup signal of the killer signal so that the program states of fuses in the system for which measurement is specified are read out. The command for the row system is a command serving for initial setting of the row system and initialization of the counter. The command for the column system is a command for switching to measurement of the column system for initial setting. The program fuse counter is not reset at this time. With these commands, fuses of the row system and fuses of the column system can be read out.

Furthermore, providing the read-out command separately is advantageous in that the read cycle can be controlled independently of the clock for SDRAM devices with high clock frequency. In this case, the read cycle is between the read-out commands. In addition, to read out the program state of a fuse more easily, only one of the row system and the column system may be provided. To read out the program states of fuses in one of the row system and column system, about half the fuses are checked, which ensures sufficient accuracy. Also when the program states of fuses in one of the row system and the column system are read out, a fuse-cutting success rate with high accuracy according to the present invention can be obtained.

Although the present invention has been described in detail by way of embodiments, the present invention is not limited to the above-described embodiments. Various modifications are conceivable within the scope of the present invention, and such modifications are also covered by the present invention.

What is claimed is:

1. A semiconductor memory device comprising:
 a fuse detection circuit including:
  a redundancy control block configured to read out a program state of each program element, the program state being one of a written state and an unwritten state, and generate a killer signal indicating one of the written state and the unwritten state of the program element; and
  a fuse-count determination circuit including:
   a counter circuit configured to count one of the written state and unwritten state indicated by the killer signal;
   a fuse block including an expected value for one of the written state and the unwritten state of the program element; and
   a coincidence detection circuit configured to compare the count by the counter circuit with the expected value to determine whether the count coincides with the expected value.

2. The semiconductor memory device according to claim 1, wherein the expected value in the fuse block includes only a part of low-order bits of the expected value.

3. The semiconductor memory device according to claim 1, wherein the counter circuit is incremented in response to a count signal input by a tester.

4. The semiconductor memory device according to claim 1, wherein the killer signal is output every one command cycle.

5. The semiconductor memory device according to claim 1, wherein the redundancy control block includes:
 a redundancy circuit selection circuit;
 a redundancy decoder circuit; and
 a decoder killer circuit,
 wherein the redundancy decoder circuit outputs a program state of each fuse.

6. The semiconductor memory device according to claim 5, wherein the redundancy decoder circuit includes:
 an enable determination circuit configured to output a program state of an enable fuse;
 an address determination circuit configured to output a program state of an address fuse; and
 a decoder output circuit,
 wherein the decoder output circuit receives outputs from the enable determination circuit and the address determination circuit and outputs a program state of each fuse.

7. A semiconductor memory device comprising:
a fuse detection circuit for detecting program information stored in fuse elements including:
- a redundancy control circuit for controlling addresses of a redundancy memory array included in a semiconductor memory device, the redundancy control circuit generating a killer signal indicating one of a written state and an unwritten state read out from each of the fuse elements; and
- a fuse count determination circuit including;
  - a counter circuit responsive to the killer signal for counting one of the written state and the unwritten state of the fuse elements to producing a count;
  - storing means for storing data representing an expected value of the fuse elements in one of the written state and the unwritten state;
  - a coincidence detection circuit configured to compare the count with the data representing the expected value to determine whether the count coincides with the expected value.

8. A fuse detection method comprising the steps:
reading out a program state of each program element, the program state being one of a written state and an unwritten state, and generating a killer signal indicating one of the written state and the unwritten state of the program element;
counting one of the written state and unwritten state indicated by the killer signal to obtain a count value;
inputting an expected value for one of the written state and the unwritten state of the program element; and
determining whether the count value coincides with the expected value by comparing the count value with the expected value.

9. The fuse detection method according to claim 8, wherein only a part of low-order bits of the expected value is input.

10. The fuse detection method according to claim 8, wherein if it is determined that the count value does not coincide with the expected value in the determining step, the count value is incremented and is compared with the expected value.

11. A fuse detection circuit including:
a redundancy control block configured to read out a program state of each program element, the program state being one of a written state and an unwritten state, and generate a killer signal indicating one of the written state and the unwritten state of the program element; and
a fuse-count determination circuit including:
- a counter circuit configured to count one of the written state and unwritten state indicated by the killer signal;
- a fuse block including an expected value for one of the written state and the unwritten state of the program element; and
- a coincidence detection circuit configured to compare the count by the counter circuit with the expected value to determine whether the count coincides with the expected value.

12. The fuse detection circuit according to claim 11, wherein the expected value in the fuse block includes only a part of low-order bits of the expected value.

13. The fuse detection circuit according to claim 11, wherein the counter circuit is incremented in response to an input from a tester.

14. The fuse detection circuit according to claim 11, wherein the redundancy control block includes:
a redundancy circuit selection circuit;
a redundancy decoder circuit; and
a decoder killer circuit,
wherein the redundancy decoder circuit outputs a program state of each fuse.

15. The fuse detection circuit according to claim 14, wherein the redundancy decoder circuit includes:
an enable determination circuit configured to output a program state of an enable fuse;
an address determination circuit configured to output a program state of an address fuse; and
a decoder output circuit,
wherein the decoder output circuit receives outputs from the enable determination circuit and the address determination circuit and outputs a program state of each fuse.

16. A fuse detection circuit for detecting program information stored in fuse elements comprising:
a redundancy control circuit for controlling addresses of a redundancy memory array included in a semiconductor memory device, the redundancy control circuit generating a killer signal indicating one of a written state and an unwritten state read out from each of the fuse elements; and
a fuse count determination circuit including;
- a counter circuit responsive to the killer signal for counting one of the written state and the unwritten state of the fuse elements to producing a count;
- storing means for storing data representing an expected value of the fuse elements in one of the written state and the unwritten state;
- a coincidence detection circuit configured to compare the count with the data representing the expected value to determine whether the count coincides with the expected value.

* * * * *